United States Patent
Kasperkovitz

(10) Patent No.: US 7,729,678 B2
(45) Date of Patent: Jun. 1, 2010

(54) CONTROLLABLE POWER OPERATIONAL TRANSCONDUCTANCE AMPLIFIER

(75) Inventor: Wolfdietrich Georg Kasperkovitz, Waalre (NL)

(73) Assignee: Semiconductor Ideas to Market (ITOM) BV, Breda (NL)

( * ) Notice: Subject to any disclaimer, the term of this patent is extended or adjusted under 35 U.S.C. 154(b) by 584 days.

(21) Appl. No.: 11/632,602

(22) PCT Filed: Jul. 19, 2005

(86) PCT No.: PCT/EP2005/007981

§ 371 (c)(1),
(2), (4) Date: Jan. 16, 2007

(87) PCT Pub. No.: WO2006/013019

PCT Pub. Date: Feb. 9, 2006

(65) Prior Publication Data

US 2008/0032656 A1    Feb. 7, 2008

(30) Foreign Application Priority Data

Aug. 2, 2004    (EP) .................................. 04077209

(51) Int. Cl.
*H04B 1/18* (2006.01)
*H03F 3/45* (2006.01)

(52) U.S. Cl. .................... 455/293; 455/332; 455/334; 455/341; 330/253; 330/254; 330/257

(58) Field of Classification Search ................ 455/293, 455/332, 333, 341, 130, 230, 227, 252.1, 455/253.2, 280, 289, 309, 311, 312, 334; 327/359; 330/25–258, 261, 265, 267, 271
See application file for complete search history.

(56) References Cited

U.S. PATENT DOCUMENTS

| 5,442,320 | A | * | 8/1995 | Kunst et al. .................. 330/267 |
| 5,598,129 | A | | 8/1995 | Chambers |
| 5,939,944 | A | * | 8/1999 | Gibson ....................... 330/255 |
| 5,990,741 | A | * | 11/1999 | Yamamoto et al. .......... 330/253 |
| 6,566,949 | B1 | * | 5/2003 | Park ............................ 330/252 |
| 6,624,698 | B2 | * | 9/2003 | Nagaraj ...................... 330/258 |

(Continued)

FOREIGN PATENT DOCUMENTS

DE    196 34 052 A    3/1998

(Continued)

*Primary Examiner*—Pablo N Tran
(74) *Attorney, Agent, or Firm*—Robert M. McDermott, Esq.

(57) ABSTRACT

Controllable operational transconductance power amplifier (controllable power OTA) including an input stage receiving a differential input signal (Ovin) and deriving therefrom first (i1) and second (i2) low power current signals being coupled to first (ccs1) and second (ccs2) current controlled output current sources being arranged in class B push pull configuration. To obtain an effective gain control while securing power efficiency and linearity, the overall gain of the power OTA is controlled by varying the gain or transconductance of the input stage (c15) and by the use of means for bi-directionally rectifying said first (i1) and second (io) low power current signals and providing in mutual alternation power amplification of said first (i1) and second (i2) low power current signals into first (I01) and second (Io2) mutually exclusive high power current output signals, which are supplied through a current summer to a current output (I0) of said linear power amplifier.

26 Claims, 2 Drawing Sheets

U.S. PATENT DOCUMENTS 6,753,732 B1 * 6/2004 Moreland ............... 330/261
6,828,855 B1 * 12/2004 Wang .................. 330/253
7,071,778 B2 * 7/2006 Butler ................. 330/253
7,164,317 B1 * 1/2007 Lorenz ................ 330/255

FOREIGN PATENT DOCUMENTS

EP          0265 680 A    5/1998

* cited by examiner

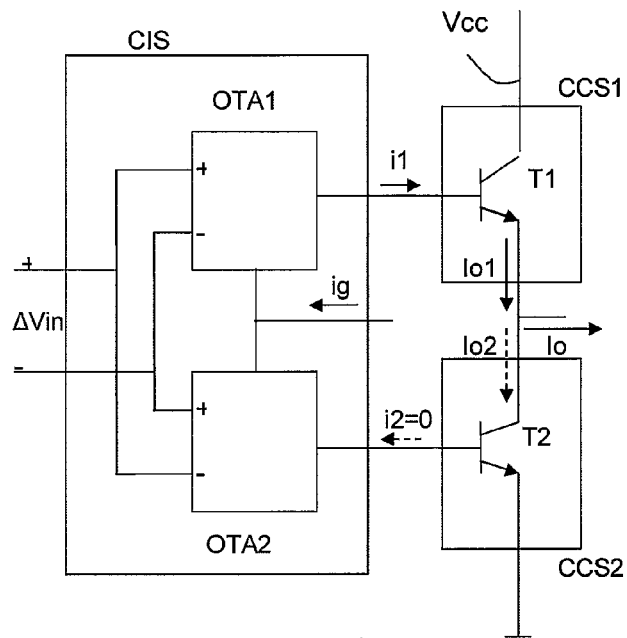
Figure 1
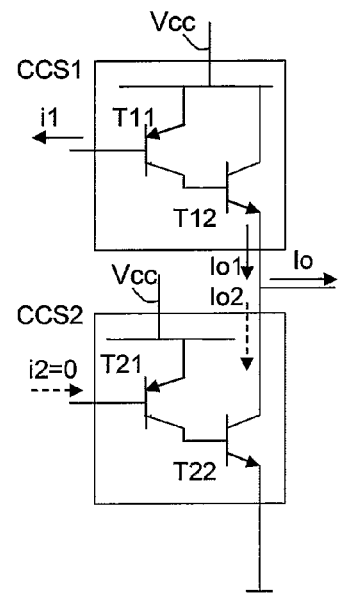
Figure 2
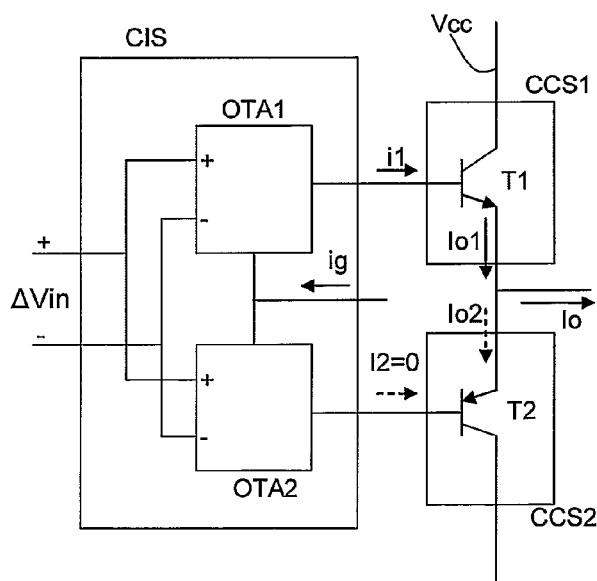
Figure 3
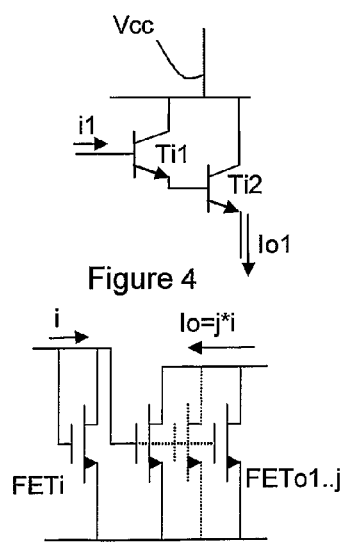
Figure 4
Figure 5

CONTROLLABLE POWER OPERATIONAL TRANSCONDUCTANCE AMPLIFIER

The invention relates to a controllable power operational transconductance amplifier (OTA) suitable for use in a wide field of applications, including portable radio and audio sets, mobile telephone handsets, etcetera. Such controllable power OTA is on itself known e.g. from U.S. Pat. No. 5,598,129.

In principle, an OTA derives an output current from a differential input voltage, the ratio of the output current to the differential input voltage being the transconductance $g_m$, of the amplifier. In linear OTAs the output current varies proportional to said differential input voltage. OTAs have many applications in particular in the field of radio, television and telecommunication, and are configured to provide a variety of functions such as slew rate limiting, filtering or signal level regulation.

A specific area of application for OTAs includes portable devices such as PDAs, portable MP3 players, portable radio and television receivers and mobile telephone handsets. In portable devices electrical power is provided by a battery, making power efficiency a primary design target in this specific area of application. Other design targets, which in particular hold for mobile telephone handsets, are robustness, weight and size reduction and low cost implementation, requiring to maximize circuit integration and to reduce the number of IC external components.

The prior art controllable power OTA as disclosed in the above mentioned U.S. Pat. No. 5,598,129 comprises a class A input stage effectuating fixed maximum gain amplification followed by a class-AB amplifier stage. To reduce power dissipation the static or quiescent currents which are needed in said class-AB amplifier stage to establish voltage and other set levels, are being reduced in a trade off with cross-over distortion. This trade off limits power saving to the minimum quiescent current level below which said distortion exceeds an unacceptable level.

Furthermore, the overall gain of said prior art controllable power OTA is controlled by a variable attenuation of the fixed maximum power output signal of the class-AB amplifier stage. This is obtained with a controllable class A attenuator following said class-AB amplifier stage by effecting a variable power loss. This power loss is essential to the control of the overall gain of the prior art power OTA and is always there, even when there is no input signal. In practice the gain needed for a comfortable sound volume level within a normal volume control range amounts to an average of not more than 20% of the gain at maximum volume setting. This means that averagely about 80% of the power output of the class-AB amplification stage is wasted, exceeding by far the limited power saving obtained by the above trade off within said class-AB amplifier stage.

It is an object of the present invention to substantially improve the performance of controllable power OTAs, in particular on power saving at any volume control setting, physical size and cost of manufacturing while without affecting linearity of operation.

It is another object of the invention to substantially improve the separation of RF and baseband signals occurring in e.g. headphone wirings of portable radio receivers.

Now, therefore, a controllable power OTA according to the invention is characterized by a symmetrically structured, controllable input stage for controlling the overall power gain of the power OTA, receiving a differential input signal and deriving therefrom first and second, mutually matched low power current signals being coupled to first and second current controlled output current sources being arranged in class B push pull configuration, including means for bi-directionally rectifying said first and second low power current signals and providing in mutual alternation power amplification of said first and second low power current signals into first and second mutually exclusive high power current output signals being supplied through a current summer to a current output of said controllable power amplifier.

The invention is based on the insight that unlike voltage signals, current signals can be rectified accurately with respect to zero value by the simple use of diodes, bipolar or MOSFET transistors. Processing current signals instead of voltage signals allows for a proper class B push pull amplification, which does not need any quiescent current to avoid cross-over distortion. By applying the measures according to the invention the overall power gain control of the OTA is provided by the controllable input stage, i.e. in the low power signal part of the controllable power OTA where at any setting within the gain control range, linearity and power efficiency within this input stage can easily be obtained. Power gain is being provided with the push pull configured pair of first and second output current sources of the class B output stage. To secure proper class B power amplification without the need for a quiescent current, the first and second low power current signals provided by the controllable input stage are alternately amplified within the respective first and second output current sources during mutually exclusive signal periods into alternately occurring, mutually exclusive high power first and second output currents. These mutually exclusive high power first and second output currents are combined into said summer into a continuous high power output current. When there is no input signal, both first and second current controlled current sources are fully blocked and no power is consumed in said class B output stage. Furthermore, the power gain in said push pull stage is obtained by current amplification therewith avoiding the occurrence of non-linearities.

The push pull configured pair of first and second output current sources can be alternately activated by said first and second, mutually matched low power current signals during mutually exclusive signal periods in various alternative ways.

In a preferred embodiment said first and second low power current signals are mutually matched in that they are identical in amplitude and signal waveform, hereinafter also being shortly referred to as identical, and supplied in mutually opposite directions to a pair of unidirectional current rectifiers being coupled in mutually same direction of conductivity and included in said means for bi-directionally rectifying said first and second low power current signals.

In an alternative preferred embodiment said first and second low power current signals are mutually matched in that they are identical and supplied in mutually same direction to a pair of unidirectional current rectifiers being coupled in mutually opposite direction of conductivity and included in said means for bi-directionally rectifying said first and second low power current signals.

In a cost effective and robust embodiment of the controllable power OTA according to the invention said first and second current controlled output current sources comprise respectively first and second transistors having their collector-emitter paths serially connected between a bias voltage and mass, the first and second low power current signals being supplied to the base electrodes of said first and second transistors, respectively, the base-emitter p-n junctions of said first and second transistors constituting said means for bi-directionally rectifying said first and second low power current signals.

In an embodiment of the controllable power OTA according to the invention, the controllable input stage being symmetrical in structure and including first and second mutually matched input OTAs each comprising a differential pair of transistors masscoupled through a common controllable current source, said differential pairs of transistors respectively receiving said differential input signal in mutual phase opposition and providing said first and second low power current signals with zero DC level to said means for bi-directionally rectifying said first and second low power current signals.

In another embodiment of the controllable power OTA according to the invention the controllable input stage includes an input OTA comprising a differential pair of transistors masscoupled through a common controllable current source and receiving said differential input signal, said differential pair of transistors providing through common current mirror means said first and second low power current signals in mutually opposite polarities with zero DC level to means for bi-directionally rectifying said first and second low power current signals.

To obtain simultaneously effective rectification and efficient power amplification, an embodiment of the controllable power OTA according to the invention is characterized by said first and second current controlled output current sources being mutually identical and each comprising a bipolar PNP transistor having its base electrode coupled to the controllable input stage to receive said first and second low power current signals, respectively, its emitter to a bias voltage and its collector to the base electrode of a bipolar NPN transistor, the base-emitter p-n junction of the bipolar PNP transistors of said first and second current controlled output current sources constituting said pair of unidirectional rectifiers, the bipolar NPN transistors of said first and second current controlled output current sources being cascode coupled between said bias voltage and mass and providing said first and second mutually exclusive high power current output signals.

An alternative embodiment said first and second current controlled output current sources being provided with respectively a pair of bipolar NPN transistors arranged in Darlington pair configuration.

In a MOSFET implementation, the controllable power OTA according to the invention is characterized by said first and second current controlled output current sources being provided with respectively MOSFET current mirror means with scaled input and output current mirror stages.

The invention also relates to a receiver using a controllable power OTA.

To reduce the costs of implementation without reducing performance the receiver according to the invention is characterized by said controllable power OTA being coupled in common to a sound reproduction device and an antenna input of said receiver. This measure allows to use a single wire for conveying audio signals from said controllable power OTA to said sound reproduction device on the one hand and for receiving RF broadcast signals and supplying the same to the receiver antenna input on the other hand, while securing effective separation between these signals without the use of capacitors and/or coils.

These and further aspects and advantages of the invention will be discussed more in detail hereinafter with reference to the disclosure of preferred embodiments, and in particular with reference to the appended Figures in which like reference numerals refer to like elements wherein:

FIG. 1 is a first embodiment of a controllable power OTA according to the invention;

FIG. 2 is a second embodiment of a controllable power OTA according to the invention;

FIG. 3 is a push pull configuration of high gain first and second current controlled output current sources for use in a controllable power OTA according to the invention;

FIG. 4 is an alternative high gain embodiment of a current controlled output current source for use in a controllable power OTA according to the invention;

FIG. 5 is a MOSFET embodiment of a current controlled output current source for use in a controllable power OTA according to the invention;

Figure 6:
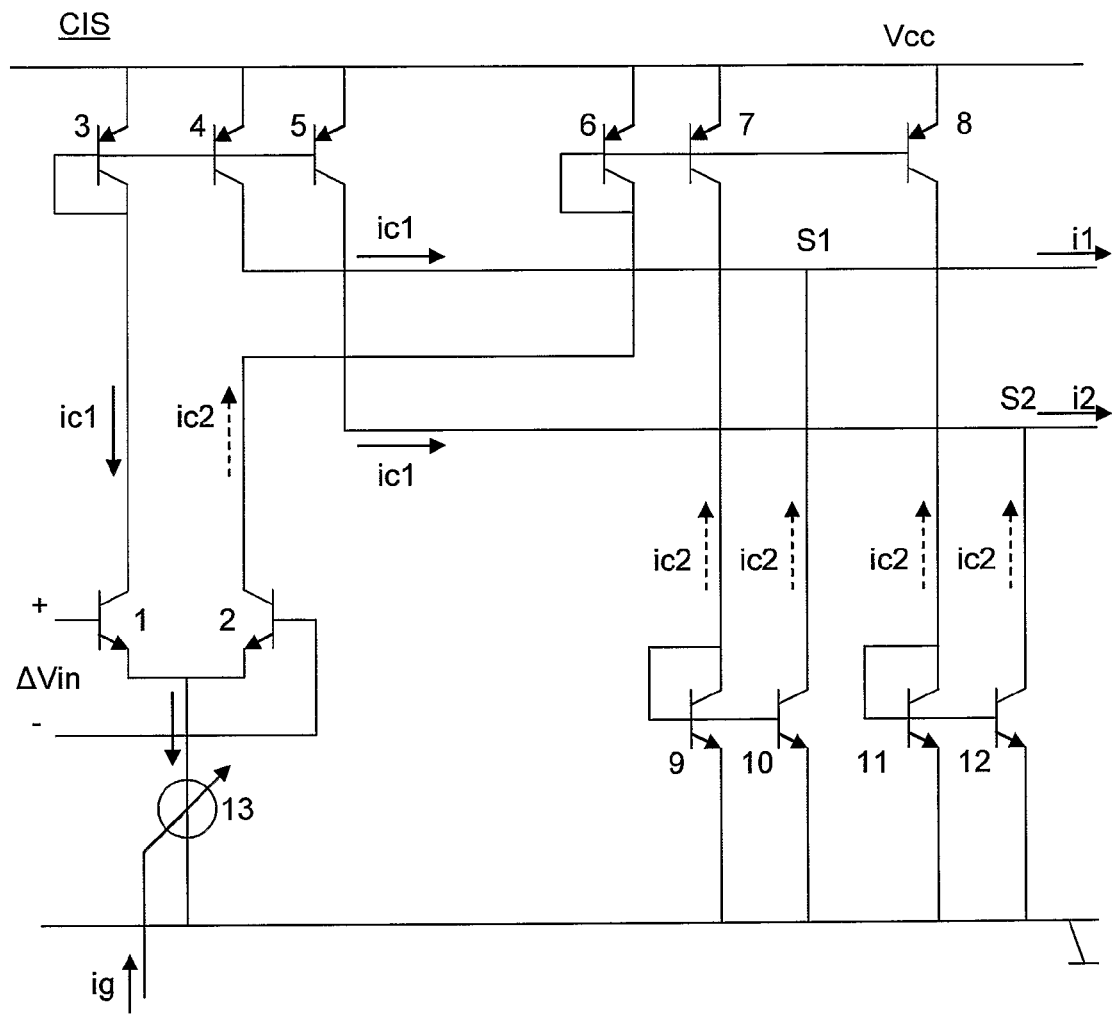
FIG. 6 is an embodiment of a controllable input stage for use in said second embodiment of the controllable power OTA according to the invention.

FIG. 1 shows a controllable power OTA according to the invention comprising a controllable input stage CIS receiving a differential input signal $\Delta$Vin and deriving therefrom first and second low power current signals i1 and i2 respectively, which are coupled to first and second current controlled output current sources CCS1 and CCS2 respectively, being arranged in class B push pull configuration. The controllable input stage CIS comprises first and second mutually identical, also referred to as first and second mutually matched, auxiliary operational transconductance amplifiers OTA1 and OTA2 each having a differential voltage input and a single current output. The controllable input stage CIS is therewith symmetrical in structure. For OTA1 and OTA2 conventional OTAs may be used such as e.g. known from National Semiconductor Datasheet on IC type LM13700 Dual Operational Transconductance. The transconductance $g_m$, of this known OTA is variable by varying a bias current thereof. For further details of this known controllable OTA, reference is made to the abovementioned Datasheet publication. These details have been omitted inasmuch as such details are not necessary to obtain a complete understanding of the present invention and are within the skill of persons of ordinary skill in the relevant art.

In the embodiment shown the differential input signal $\Delta$Vin is supplied with mutual opposite polarities to the differential inputs of OTA1 and OTA2. As a result thereof the output current signals i1 and i2 of OTA1 and OTA2, hereinafter also being referred to as first and second low power current signals, vary proportionally with the differential input signal $\Delta$Vin, and are mutually identical in amplitude and signal wave form, hereinafter being shortly referred to as identical, with mutually opposite polarities or directions.

These first and second low power current signals i1 and i2 of OTA1 and OTA2, are respectively supplied to base electrodes of first and second mutually identical NPN transistors T1 and T2, which transistors constitute said first and second current controlled output current sources CCS1 and CCS2, respectively. The collector emitter paths of said first and second NPN transistors T1 and T2 are serially connected between bias voltage Vcc and mass, whereas the common connection between the emitter of T1 and the collector of T2 is coupled to a single current output of the controllable power OTA according to the invention.

The first and second low power current signals i1 and i2 of OTA1 and OTA2 are being amplified in said first and second NPN transistors T1 and T2 during those half cycle periods, in which the direction of these first and second low power current signals i1 and i2 corresponds to the direction of conductivity of the base-emitter p-n diode junction of T1 and T2. As these first and second low power current signals i1 and i2 are mutually identical and have mutually opposite directions, either T1 is blocking and T2 is conducting, or vice versa. Suppose, by way of example, that during the even periods Δt0, Δt2, Δt4, of a consecutive sequence of half cycle periods Δt0, Δt1, Δt2, Δt3, Δt4, etcetera, the direction of i1 corresponds to the direction of conductivity of the base-emitter p-n diode junction of T1 as illustrated in FIG. 1. Then during these even periods Δt0, Δt2, Δt4 the second low power current i2 is absent (indicated with a dotted arrow), as T2 is blocking. However, during the odd periods Δt1, Δt3, . . . of said consecutive sequence of half cycle periods Δt0, Δt1, Δt2, Δt3, Δt4, . . . the direction of i2 corresponds to the direction of conductivity of the base-emitter p-n diode junction of T2, whereas in these odd periods i1 is absent as then T1 is blocking (not shown). Consequently, current amplification of said first and second low power current signals i1 and i2 in said first and second NPN transistors T1 and T2 occur accurately in mutually exclusive half cycle signal periods. As a result thereof, first and second mutually exclusive high power current output signals are obtained at the emitter of T1 and the collector of T2, which add up into a single periodic high power current output signal Io. The common connection of the emitter of T1 and the collector of T2 therewith functions as a current summer.

The base-emitter diodes of T1 and T2 therewith function as a pair of unidirectional rectifiers being coupled in mutually same direction of conductivity as seen from the output of the controllable input stage CIS. With the supply of first and second low power current signals i1 and i2 in mutually opposite directions to the base electrodes of T1 and T2, respectively, T1 and T2 operate as bi-directional rectifier means, providing accurate rectification of the first and second low power current signals i1 and i2 at zero current value. Precisely at each zero crossing, T1 changes from blocking or passive state into conducting or active state and T2 from conducting or active state blocking into passive state, or vice versa. T1 and T2 therewith operate in class B push pull configuration, i.e. without the need for a quiescent current. At zero value current input signal both transistors T1 and T2 are blocked and no power is used. As a result thereof said class B push pull arrangement of T1 and T2 operates at maximum current gain without power loss, i.e. at maximum power efficiency.

With the overall power gain of the power OTA according to the invention being controlled in the low power stage and current power amplification in the class B push pull arrangement of T1 and T2, maximum power efficiency is secured at any gain or volume setting.

Furthermore first and second low power current signals i1 and i2 vary proportionally with the differential input signal ΔVin at any value of the transconductance $g_m$, whereas both transistors T1 and T2 provide constant current amplification. This secures linear operation throughout the controllable power OTA as a whole at any setting within the gain control range.

FIG. 2 shows a second embodiment of a controllable power OTA according to the invention in which the differential input signal ΔVin is supplied with mutual same polarity to the differential inputs of said first and second mutually identical auxiliary operational transconductance amplifiers OTA1 and OTA2 of the controllable input stage CIS. The first and second low power current signals i1 and i2 of OTA1 and OTA2, which vary proportionally with the differential input signal ΔVin, are mutually identical and are supplied in mutually same polarity or direction to base electrodes of NPN transistor T1 and PNP transistor T2, respectively. The base-emitter p-n junctions of T1 and T1 function as a pair of unidirectional rectifiers being coupled in mutually opposite direction of conductivity as seen from the output of the controllable input stage CIS. With the supply of first and second low power current signals i1 and i2 in mutually same direction to the base electrodes of T1 and T2, respectively, T1 and T2 operate as bi-directional rectifier means, providing accurate rectification of the first and second low power current signals i1 and i2 at zero current value. The collector-emitter path of T1 is serially connected to the emitter-collector path of T2 between said bias voltage and mass. T1 and T2 therewith obtaining class B push pull current amplification of said first and second low power current signals i1 and i2 in said first and second NPN transistors T1 and T2, accurately occurring in mutually exclusive half cycle signal periods. As a result thereof, first and second mutually exclusive high power current output signals Io1 and Io2 are obtained at the emitters of T1 and T2, respectively, which add up into a single periodic high power current output signal Io at the current output of the controllable power OTA. The common connection of the emitter of T1 and the collector of T2 therewith functions as a current summer.

FIG. 3 is a push pull configuration of high gain two stage first and second current controlled output current sources CCS1 and CCS for use in a controllable power OTA according to the invention as shown in FIG. 1. In this embodiment said first and second current controlled output current sources CCS1 and CCS2 are mutually identical and respectively comprise first stage bipolar PNP transistors T11 and T21, respectively, having base electrodes coupled to the controllable input stage CIS to receive said first and second low power current signals i1 and i2, respectively. The emitters of T11 and T21 are coupled to the bias voltage Vcc and the collectors to base electrodes of second stage bipolar NPN transistors T12 and T22, respectively. The base-emitter p-n junction of the bipolar PNP transistors T11 and T21 of said first and second current controlled output current sources constitute said pair of unidirectional rectifiers, the bipolar NPN transistors T12 and T22 of said first and second current controlled output current sources CCS1 and CCS2 are cascode coupled between said bias voltage Vcc and mass and provide first and second mutually exclusive high power current output signals Io1 and Io2, respectively. The gain of said first and second current controlled output current sources CCS1 and CCS2 is respectively determined by the current gain factor of NPN transistor T11 multiplied by the gain factor of the PNP transistor T12, and by the current gain factor of NPN transistor T21 multiplied by the gain factor of the PNP transistor T22.

FIG. 4 is an alternative high gain embodiment of a current controlled output current source for use in a controllable power OTA according to the invention as shown in FIG. 1, in which said first and second current controlled output current sources CCS1 and CCS2 are respectively provided with a pair of bipolar NPN transistors Ti1 and Ti2 arranged in Darlington pair configuration. Also here, the gain of said first and second current controlled output current sources CCS1 and CCS2 is respectively determined by the current gain factor of T11 multiplied by the gain factor of Ti1 of this Darlington pair.

FIG. 5 is a MOSFET embodiment of a current controlled output current source which can be applied in each of both first and second current controlled output current sources CCS1 and CCS2 in a controllable power OTA according to the invention. In the embodiment shown, the current controlled output current source comprises MOSFET current mirror means with scaled input and output current mirror stages. The input mirror stage of comprises an input N-gate MOSFET FETi receiving a low power input current i being one of said first and second low power current signals i1 and i2, at its drain electrode. The gate-source voltage of the input N-gate MOSFET FETi is applied across the gate and source electrodes of each of the parallel arrangement of N-gate MOSFETs FETo1 to FEToj constituting said output current mirror stage. With identical MOSFETs in both input and output current mirror stages a scaling factor j is being obtained, meaning that the high power output current signal Io provided by the output current mirror stage amounts to j times the low power input current I, i.e. Io=j*i.

FIG. 6 shows an alternative embodiment of the controllable OTA input stage CIS for use in said second embodiment of the power OTA according to the invention including a differential pair of transistors 1, 2, the base electrodes thereof constituting the differential input of the controllable OTA input stage CIS, the emitters being coupled in common to controllable current source 14 supplying the controllable gain setting current ig setting the controllable OTA input stage CIS at a wanted transconductance $g_m$ or gain factor. A differential input voltage signal ΔVin is coupled between the base electrodes of the differential pair of transistors 1, 2 causing collector output currents ic1 and ic2 to occur at the collectors of said differential pair of transistors 1, 2 in mutually opposite directions. The collector output current ic1 is mirrored in current mirror 3-5 into a pair of mutually identical currents ic1 which are supplied to first and second summers S1 and S2, respectively. The collector output current ic2 is mirrored in current mirror 6-8 into a pair of mutually identical currents ic2 which are mirrored again in current mirrors 9,10 and 11,12. The output currents ic2 of said current mirrors 9,10 and 11,12 are supplied to said first and second summers S1 and S2, respectively. In each of said first and second summers S1 and S2 currents ic1 and ic2 are added to form mutually identical low power output currents i1 and i2, respectively of the controllable inout stage CIS.

Figure 7:
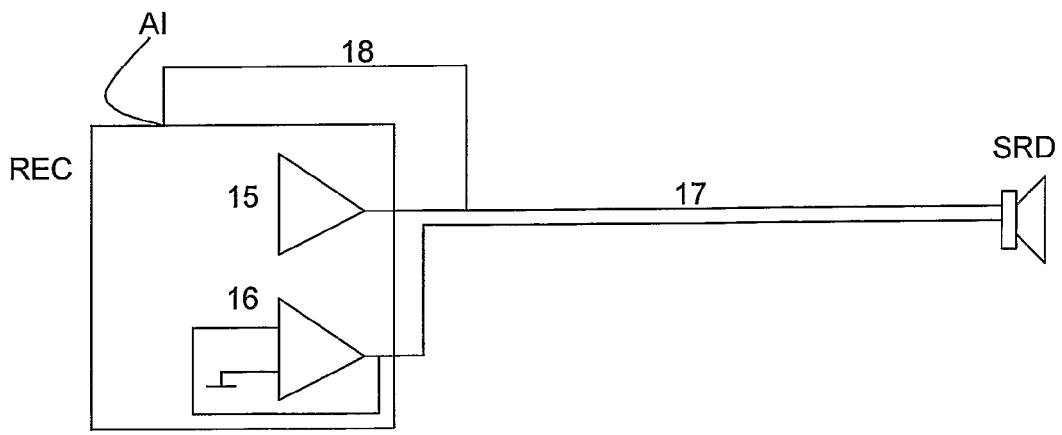
FIG. 7 is a radio receiver using a controllable power OTA according to the invention.

FIG. 7 shows a radio receiver REC using a controllable power OTA according to the invention 15 for supplying an audio signal through two wire line 17 to a sound reproduction device SRD. The sound reproduction device SRD is mass connected through an OTA 16. The line 17 is used to receive RF broadcast signals, which are supplied to an antenna input AI of the radio receiver REC. Due to the low output impedance of the controllable power OTA 15 and OTA 16 noise interferences, such as click noise, which are present or induced in said line 17, are effectively shortcircuited to mass and are therewith prevented from disturbing said RF broadcast signals without the use of expensive additional selective elements such as capacitors and/or coils.

Now, the present invention has hereabove been disclosed with reference to preferred embodiments thereof. Persons skilled in the art will recognize that numerous modifications and changes may be made thereto without exceeding the scope of the appended Claims. For instance, in the embodiments of the controllable power OTA according to the invention as shown in FIG. 2 measures could be taken within the normal ability of persons skilled in the art to secure T1 and T2 to provide equal gain factors, or to use low power current signals i1 and i2 which are not mutually identical compensating gain differences in T1 and T2.

In consequence, the embodiments should be considered as being illustrative, and no restriction should be construed from those embodiments, other than as have been recited in the Claims.

The invention claimed is:

1. A controllable operational transconductance power amplifier (power OTA) comprising:
    a controllable input stage that is configured to:
        control the overall power gain of the power OTA,
        receive a differential input signal, and
        derive therefrom first and second, mutually matched low power current signals; and
    first and second current controlled output current sources, operably coupled to the controllable input stage for receiving the low power current signals, arranged in class B push pull configuration, and configured to bi-directionally rectify the first and second low power current signals to provide, in mutual alternation, power amplification of the first and second low power current signals into first and second mutually exclusive high power current output signals that are supplied through a current summer to a current output of the controllable power amplifier.

2. The power amplifier of claim 1, wherein:
    the output current sources include a pair of unidirectional current rectifiers, and
    the first and second low power current signals are substantially mutually identical and are supplied in mutually opposite directions to the pair of unidirectional current rectifiers, which are coupled in a mutually same direction of conductivity.

3. The power amplifier of claim 2, wherein;
    the first and second current controlled output current sources are substantially mutually identical and each includes a bipolar PNP transistorwith:
        a base electrode coupled to the controllable input stage to receive the first and second low power current signals, respectively,
        an emitter coupled to a bias voltage, and
        a collector coupled to a base electrode of a bipolar NPN transistor,
    base-emitter p-n junctions of the bipolar PNP transistors form the pair of unidirectional rectifiers,
    collector-emitter paths of the bipolar NPN transistors are serially connected between the bias voltage and a reference voltage, and provide the first and second mutually exclusive high power current output signals at the current output of the controllable power amplifier.

4. The power amplifier of claim 2, wherein:
    the first and second current controlled output current sources include first and second transistors having their collector-emitter paths serially connected between a bias voltage and a reference voltage, and
    the first and second low power current signals are supplied to the base electrodes of the first and second transistors, respectively, so that the base-emitter p-n junctions of the first and second transistors form the pair of unidirectional current rectifiers.

5. The power amplifier of claim 2, wherein:
    the controllable input stage includes an input OTA that includes a differential pair of transistors that are coupled through a common controllable current source, and
    the differential pairs of transistors respectively receive the differential input signal in mutual phase opposition and provide the first and second low power current signals with a substantially zero DC level to the output current sources.

6. The power amplifier of claim 2, wherein:
    the controllable input stage includes an input OTA that includes a differential pair of transistors coupled through a common controllable current source, and is configured to receive the differential input signal, and
    the differential pair of transistors provide, through a common current mirror, the first and second low power current signals in mutually opposite polarities with a substantially zero DC level to the output current sources.

7. The power amplifier of claim 2, wherein the first and second current controlled output current sources include, respectively, a pair of bipolar NPN transistors arranged in Darlington pair configuration.

8. The power amplifier of claim 2, wherein the first and second current controlled output current sources include, respectively, a MOSFET current mirror with scaled input and output current mirror stages.

9. The power amplifier of claim 1, wherein:
the output current sources include a pair of unidirectional current rectifiers, and
the first and second low power current signals are substantially mutually identical and are supplied in a mutually same direction to the pair of unidirectional current rectifiers, which are coupled in a mutually opposite direction of conductivity.

10. The power amplifier of claim 9, wherein:
the first and second current controlled output current sources include first and second transistors having their collector-emitter paths serially connected between a bias voltage and a reference voltage, and
the first and second low power current signals are supplied to the base electrodes of the first and second transistors, respectively, so that the base-emitter p-n junctions of the first and second transistors form the pair of unidirectional current rectifiers.

11. The power amplifier of claim 9, wherein:
the controllable input stage includes an input OTA that includes a differential pair of transistors that are coupled through a common controllable current source, and
the differential pairs of transistors respectively receive the differential input signal in mutual phase opposition and provide the first and second low power current signals with a substantially zero DC level to the output current sources.

12. The power amplifier of claim 9, wherein the first and second current controlled output current sources include, respectively, a pair of bipolar NPN transistors arranged in Darlington pair configuration.

13. The power amplifier of claim 9, wherein the first and second current controlled output current sources include, respectively, a MOSFET current mirror with scaled input and output current mirror stages.

14. The power amplifier of claim 1, wherein:
the first and second current controlled output current sources include first and second transistors having their collector-emitter paths serially connected between a bias voltage and a reference voltage, and
the first and second low power current signals are supplied to the base electrodes of the first and second transistors, respectively, so that the base-emitter p-n junctions of the first and second transistors bi-directionally rectify the first and second low power current signals.

15. The power amplifier of claim 14, wherein:
the controllable input stage includes an input OTA that includes a differential pair of transistors that are coupled through a common controllable current source, and
the differential pairs of transistors respectively receive the differential input signal in mutual phase opposition and provide the first and second low power current signals with a substantially zero DC level to the output current sources.

16. The power amplifier of claim 14, wherein the first and second current controlled output current sources include, respectively, a pair of bipolar NPN transistors arranged in Darlington pair configuration.

17. The power amplifier of claim 14, wherein the first and second current controlled output current sources include, respectively, a MOSFET current mirror with scaled input and output current mirror stages.

18. The power amplifier of claim 1, wherein:
the controllable input stage includes an input OTA that includes a differential pair of transistors that are coupled through a common controllable current source, and
the differential pairs of transistors respectively receive the differential input signal in mutual phase opposition and provide the first and second low power current signals with a substantially zero DC level to the output current sources.

19. The power amplifier of claim 18, wherein the first and second current controlled output current sources include, respectively, a pair of bipolar NPN transistors arranged in Darlington pair configuration.

20. The power amplifier of claim 18, wherein the first and second current controlled output current sources include, respectively, a MOSFET current mirror with scaled input and output current mirror stages.

21. The power amplifier of claim 1, wherein:
the controllable input stage includes an input OTA that includes a differential pair of transistors coupled through a common controllable current source, and is configured to receive the differential input signal, and
the differential pair of transistors provide, through a common current mirror, the first and second low power current signals in mutually opposite polarities with a substantially zero DC level to the output current sources.

22. The power amplifier of claim 21, wherein the first and second current controlled output current sources include, respectively, a pair of bipolar NPN transistors arranged in Darlington pair configuration.

23. The power amplifier of claim 21, wherein the first and second current controlled output current sources include, respectively, a MOSFET current mirror with scaled input and output current mirror stages.

24. The power amplifier of claim 1, wherein the first and second current controlled output current sources include, respectively, a pair of bipolar NPN transistors arranged in Darlington pair configuration.

25. The power amplifier of claim 1, wherein the first and second current controlled output current sources include, respectively, a MOSFET current mirror with scaled input and output current mirror stages.

26. A receiver comprising:
an antenna,
a controllable operational transconductance power amplifier, operably coupled to the antenna, and
a sound reproduction device, operably coupled to the power amplifier, wherein
the power amplifier includes:
a controllable input stage that is configured to: control the overall power gain of the power OTA, receive a differential input signal, and derive therefrom first and second, mutually matched low power current signals; and
first and second current controlled output current sources, operably coupled to the controllable input stage for receiving the low power current signals, arranged in class B push pull configuration, and configured to bi-directionally rectify the first and second low power current signals to provide, in mutual alternation, power amplification of the first and second low power current signals into first and second mutually exclusive high power current output signals that are supplied through a current summer to a current output of the controllable power amplifier.

* * * * *